(12) United States Patent
Von Thun

(10) Patent No.: US 7,423,448 B2
(45) Date of Patent: Sep. 9, 2008

(54) RADIATION HARDENED LOGIC CIRCUIT

(75) Inventor: Matthew Von Thun, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 154 days.

(21) Appl. No.: 11/367,951

(22) Filed: Mar. 3, 2006

(65) Prior Publication Data

US 2007/0205799 A1 Sep. 6, 2007

(51) Int. Cl.
*H03K 19/007* (2006.01)
(52) U.S. Cl. .............................. 326/14; 326/9; 326/10; 326/13; 326/113
(58) Field of Classification Search ............... 326/9–14, 326/52–54, 113
See application file for complete search history.

(56) References Cited

U.S. PATENT DOCUMENTS

| | | | |
|---|---|---|---|
| 4,785,200 A | 11/1988 | Huntington | |
| 4,805,148 A | 2/1989 | Diehl-Nagle et al. | |
| 4,809,226 A | 2/1989 | Ochoa, Jr. | |
| 4,852,060 A | 7/1989 | Rockett, Jr. | |
| 4,912,675 A | 3/1990 | Blake et al. | |
| 4,914,629 A | 4/1990 | Blake et al. | |
| 4,956,814 A | 9/1990 | Houston | |
| 5,031,180 A | 7/1991 | McIver et al. | |
| 5,046,044 A | 9/1991 | Houston et al. | |
| 5,111,429 A | 5/1992 | Whitaker | |
| 5,196,734 A | 3/1993 | Han | |
| 5,307,142 A | 4/1994 | Corbett et al. | |
| 5,311,070 A | 5/1994 | Dooley | |
| 5,418,473 A | 5/1995 | Canaris | |
| 5,504,703 A | 4/1996 | Bansal | |
| 5,525,923 A | 6/1996 | Bialas, Jr. et al. | |
| 5,870,332 A | 2/1999 | Lahey et al. | |
| 6,327,176 B1 * | 12/2001 | Li et al. ....................... | 365/156 |
| 6,404,237 B1 * | 6/2002 | Mathew et al. ............... | 326/113 |
| 6,417,710 B1 | 7/2002 | Bartholet | |
| 6,573,774 B1 | 6/2003 | Gardner | |
| 6,744,661 B1 | 6/2004 | Shubat | |
| 6,831,496 B2 | 12/2004 | Gardner | |
| 6,963,217 B2 * | 11/2005 | Samudrala et al. ............ | 326/11 |
| 7,071,749 B2 | 7/2006 | Gardner | |
| 2004/0257108 A1 * | 12/2004 | Carlson et al. ................ | 326/14 |
| 2007/0097728 A1 * | 5/2007 | Fukui ......................... | 365/154 |
| 2007/0109012 A1 * | 5/2007 | Erstad et al. .................. | 326/11 |

* cited by examiner

*Primary Examiner*—Vibol Tan
(74) *Attorney, Agent, or Firm*—Peter J. Meza; William J. Kubida; Hogan & Hartson LLP

(57) ABSTRACT

A radiation-hardened logic circuit prevents SET-induced transient pulses from propagating through the circuit, using two identical logic paths. The outputs of the two logic paths are fed into an exclusive-OR gate, which controls gating circuitry. The gating circuitry can be a controlled pass-gate circuit and a data latch, an adjustable threshold comparator, or two controlled latches. Transient pulse suppression is achieved with less circuitry and expense than is found in TMR circuits.

17 Claims, 4 Drawing Sheets

RADIATION HARDENED LOGIC CIRCUIT

BACKGROUND OF THE INVENTION

The present invention is related to logic circuits that are able to provide valid output logic signals in the presence of a harsh radiation environment as is experienced in outer space.

When energetic heavy ions, like those found in space environments, collide with CMOS logic circuits, a transient current spike is introduced into the circuitry that can lead to parametric or even functional failures. The introduction of an undesirable current spike due to ionizing radiation is known as a Single Event Transient (SET).

One solution known in the art is referred to as Triple Mode Redundancy (TMR), which requires triple redundancy in at least portions of the circuit, followed by a voting circuit that returns the result common to two or more of the three redundant circuits. While the TMR solution effectively reduces the effects of transient spikes and improves circuit performance in high-radiation environments, it does so at the penalty of increased integrated circuit die area and corresponding cost. The increased integrated circuit die area can be triple or more that of an ordinary logic circuit.

What is desired is a logic circuit that can be fabricated in a cost efficient manner, but can withstand the harsh radiation environments experienced in outer space applications.

SUMMARY OF THE INVENTION

The present invention exploits the short transient nature of the SET event to eliminate one of the layers of circuit redundancy found in prior art TMR circuit solutions. In most common circuit applications, the SET-induced pulse is one or more magnitudes smaller than the data bit being processed by the logic circuitry. To prevent one of these transient pulses from propagating through the circuit, two substantially similar logic paths are provided. In an embodiment of the invention, the outputs of the two logic paths are fed into an exclusive-OR gate, a pass-gate circuit, and a data latch. In another embodiment of the invention, the functionality of the latch can be achieved by using the parasitic capacitance on the output of the pass-gate circuit, or by adding a capacitor to the output of the pass-gate circuit. Alternative embodiments of the present invention use an adjustable threshold comparator in conjunction with the exclusive-OR gate, and two controlled latches in conjunction with the exclusive-OR gate.

According to the present invention, SET protection for space-borne logic circuits is provided with only one redundant logic path. The SET protection is provided at a 33% or more reduction in integrated circuit die area over existing TMR approaches. The logic circuit of the present invention can also be used in any circuit application in addition to space applications wherein redundancy is required because of high reliability considerations.

According to the present invention a radiation-hardened logic circuit includes an exclusive-OR gate having a first input for receiving a first logic signal, a second input for receiving a second logic signal, and an output. The radiation-hardened logic circuit also includes gating circuitry having a first input for receiving the first logic signal, a second input for receiving the second logic signal, a control input coupled to the output of the exclusive-OR gate, and an output for providing an output logic signal. The logic output signal is substantially similar to the first or second logic signals, but wherein any radiation-induced pulses are substantially attenuated or removed.

In a first embodiment, the gating circuitry includes a comparator having an adjustable input switching threshold controlled by the control input.

In a second embodiment, the gating circuitry includes a first latch having an input for receiving the first logic signal, a control input coupled to the output of the exclusive-OR gate, and an output, a second latch having an input for receiving the second logic signal, a control input coupled to the output of the exclusive-OR gate, and an output, and a logic gate having a first input coupled to the output of the first latch, a second input coupled to the output of the second latch, and an output for providing the output logic signal.

In a third embodiment, the gating circuitry includes a logic gate coupled to a controlled pass-gate.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 1:
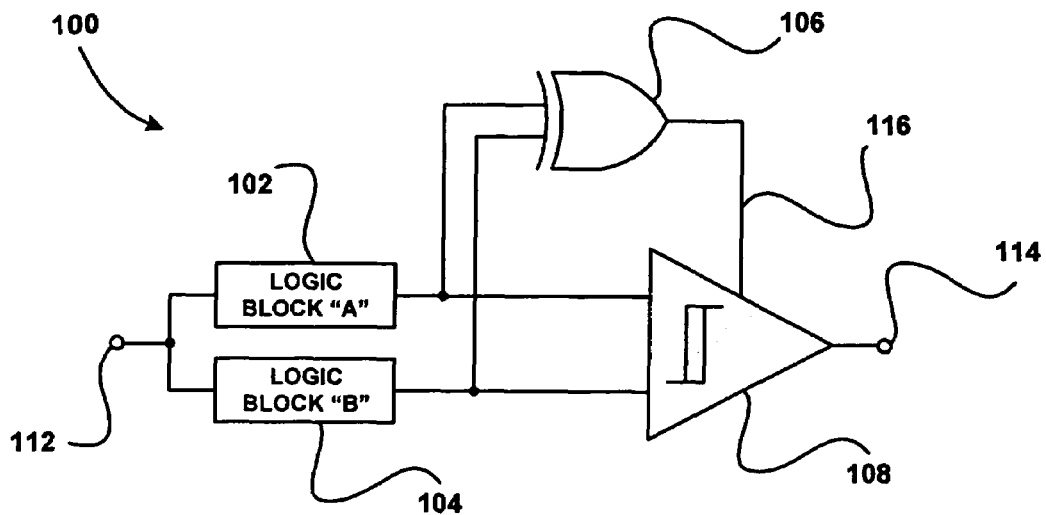
FIG. 1 is a schematic diagram of a first embodiment of the present invention using an adjustable input switching threshold comparator.
Figure 2:
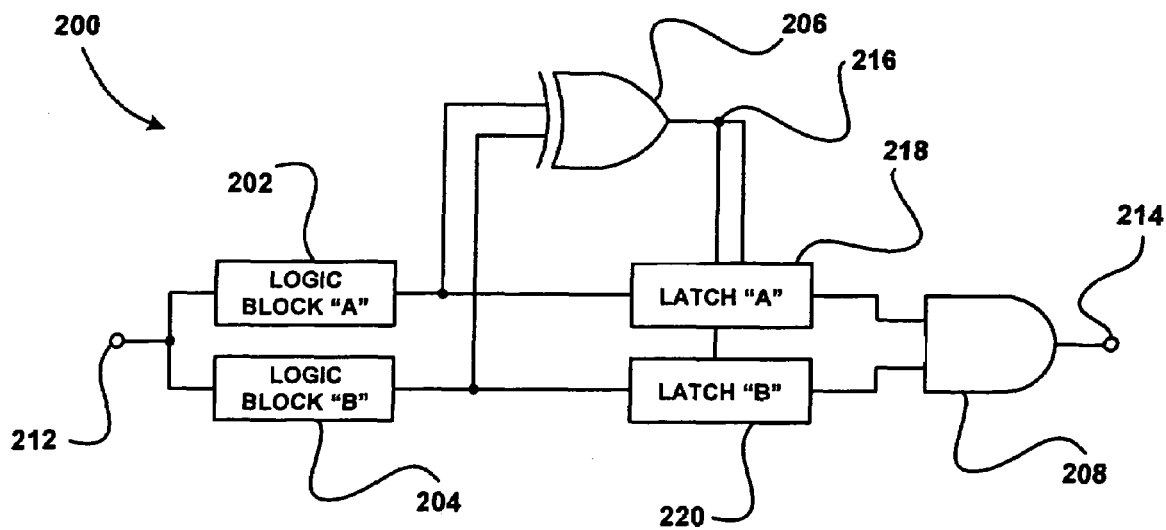
FIG. 2 is a schematic diagram of a second embodiment of the present invention using two controlled latches.
Figure 3:
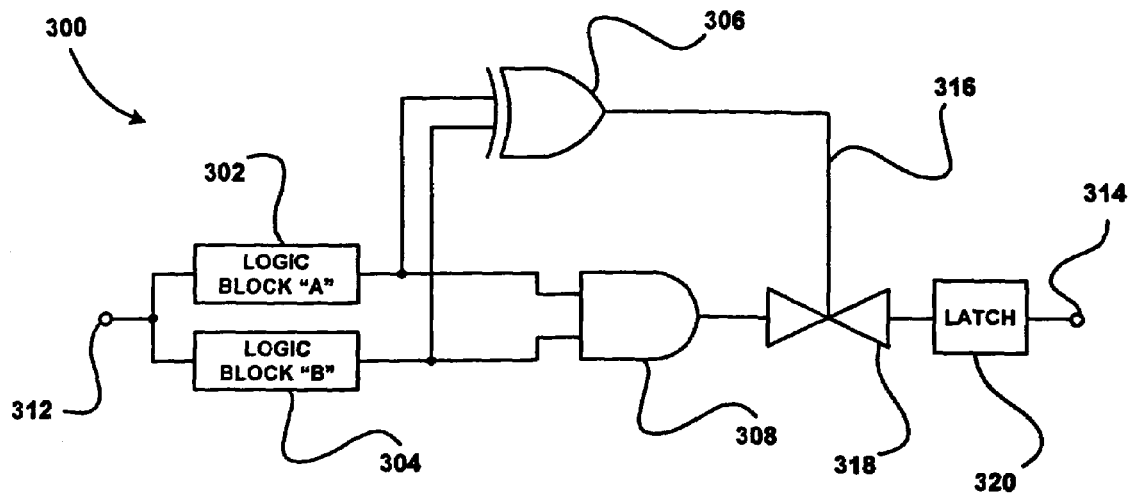
FIG. 3 is a schematic diagram of a third embodiment of the present invention using a controlled pass-gate circuit.

Referring generally now to FIGS. 1-3, a radiation-hardened logic circuit includes an exclusive-OR gate having a first input for receiving a first logic signal, a second input for receiving a second logic signal, and an output. The radiation-hardened logic circuit also includes gating circuitry having a first input for receiving the first logic signal, a second input for receiving the second logic signal, a control input coupled to the output of the exclusive-OR gate, and an output for providing an output logic signal. The logic output signal is substantially similar to the first and second logic signals, but wherein any radiation-induced pulses are substantially attenuated or removed. The radiation-hardened logic circuit further includes a first logic block having an input for receiving an original logic signal and an output for providing the first logic signal, and a second logic block having an input for receiving the original logic signal and an output for providing the second logic signal, wherein the first and second logic blocks are substantially similar and can implement any desired logic function.

Referring now to FIG. 1, a radiation-hardened logic circuit 100 includes a comparator 108 having an adjustable input switching threshold controlled by the control input 116. The original logic signal 112 drives identical logic blocks 102 and 104. The output of logic blocks 102 and 104 drives the inputs of exclusive-OR gate 106 as well as the inputs of comparator 108. The transient-suppressed logic output signal is provided at node 114.

Referring now to FIG. 2, a radiation-hardened logic circuit 200 includes a first latch 202 having an input for receiving a first logic signal from logic block 202, a control input 216 coupled to the output of the exclusive-OR gate 206, and an output. A second latch 220 has an input for receiving the second logic signal from logic block 204, a control input 216 coupled to the output of the exclusive-OR gate 206, and an output. The original logic signal 212 drives the inputs of logic blocks 202 and 204. A two-input AND gate 208 has a first input coupled to the output of the first latch 218, a second input coupled to the output of the second latch 220, and an output for providing the output logic signal at node 214.

Referring now to FIG. 3, a two-input AND gate 308 is coupled to a controlled pass-gate circuit 318. The control input 316 of the pass-gate 318 is driven by exclusive-OR gate 306. A latch 320 is coupled to the controlled pass-gate 318 and provide the logic output signal at node 314. The original logic signal 312 drives the inputs of logic blocks 302 and 304. The outputs of logic blocks 302 and 304 drive the inputs of exclusive-OR gate 306 and the inputs of two-input AND gate 308.

Figure 4:
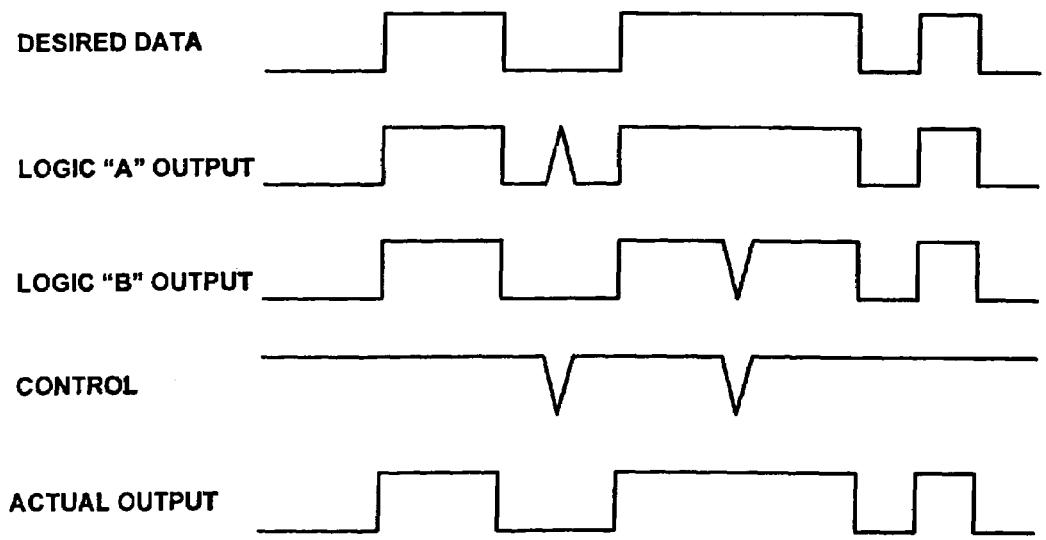
FIG. 4 is a timing diagram showing waveforms associated with each of the embodiments of the present invention shown in FIGS. 1-3.

Referring now to FIG. 4, a timing diagram is shown that generally describes the operation of each of the circuits shown in FIGS. 1-3. The first trace shows the DESIRED DATA, which is a digital waveform showing only valid high and low data states. The LOGIC "A" OUTPUT signal is similar to the DESIRED DATA signal, but contains a single SET-induced positive-going voltage spike. The LOGIC "B" OUTPUT signal is similar to the DESIRED DATA signal, but contains a single SET-induced negative-going voltage spike. The CONTROL signal corresponds to the voltage on each of nodes 116, 216, and 316 shown in FIGS. 1-3. Note that the CONTROL signal only has a negative-going output that is different than the high logic state when the LOGIC "A" and LOGIC "B" signals are different. According to the present invention, the current output state of the logic circuit is maintained unless both redundant paths agree that a transition has taken place. Only then is the gating circuitry activated and a change in the logic state can be made. Finally, the ACTUAL OUTPUT signal is provided at nodes 114, 214, or 314, is substantially free of SET-induced transient pulses as described above.

Figure 5:
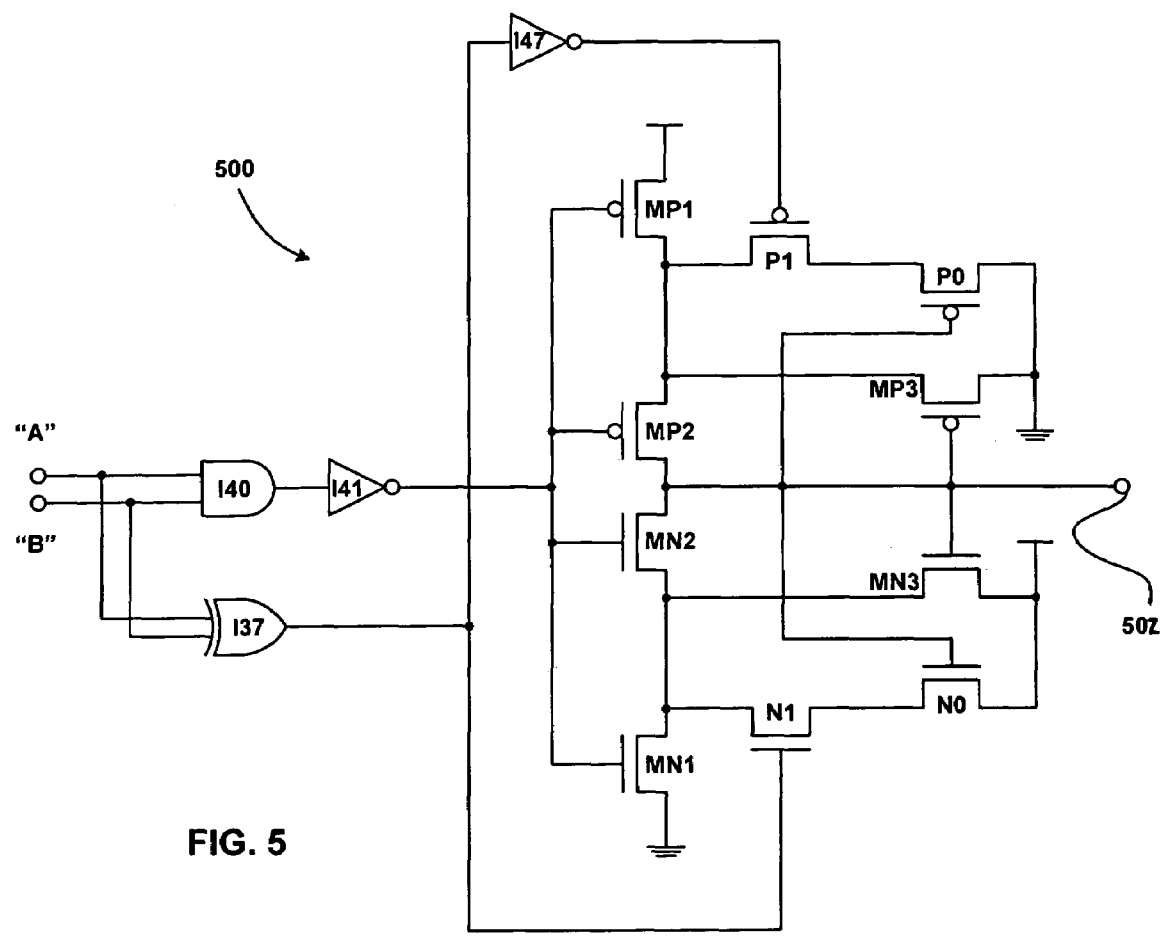
FIG. 5 is a more detailed transistor-level schematic for an implementation of the circuit shown in FIG. 1.

FIG. 5 is a more detailed transistor-level schematic for an implementation 500 of the circuit shown in FIG. 1. Radiation-hardened logic circuit 500 includes comprising a first input for receiving a first logic signal "A", a second input for receiving a second logic signal "B". Logic signals "A" and "B" are substantially similar except for the presence of radiation-induced pulses. An output at node 502 provides a logic output signal substantially similar to either the first or the second logic signal, but wherein any radiation-induced pulses are substantially attenuated or removed. A P-channel circuit portion has a signal input (gates of transistors MP1 and MP2), a control input (gate of transistor P1), and a signal output (drain of transistor MP2 and gates of transistors P0 and MP3). An N-channel circuit portion has a signal input (gates of transistors MN1 and MN2), a control input (gate of transistor N1), and a signal output (drain of transistor MN2 and gates of transistors N0 and MN3). Logic circuitry receives the first and second logic signals coupled to the signal and control inputs of the P-channel and N-channel circuit portions, the signal outputs of the P-channel and N-channel circuit portions being coupled together to provide the logic output signal at node 502.

The P-channel circuit portion includes a first P-channel transistor MP1 having a gate coupled to the signal input, a drain, and a source coupled to a source of supply voltage. A second P-channel transistor MP2 has a gate coupled to the signal input, a drain coupled to the signal output, and a source coupled to the drain of the first P-channel transistor MP1. A third P-channel transistor MP3 has a gate coupled to the signal output and a current path coupled between the source of the second P-channel transistor and ground. A fourth P-channel transistor P0 has a gate coupled to the signal output, a source, and a drain coupled to ground. A fifth P-channel transistor P1 has a gate coupled to the control input, a source coupled to the drain of the first P-channel transistor MP1, and a drain coupled to the source of the fourth P-channel transistor P0.

The N-channel circuit portion includes a first N-channel transistor MN1 having a gate coupled to the signal input, a drain, and a source coupled to ground. A second N-channel transistor MN2 has a gate coupled to the signal input, a drain coupled to the signal output, and a source coupled to the drain of the first N-channel transistor MN1. A third N-channel transistor MN3 has a gate coupled to the signal output and a current path coupled between the source of the second P-channel transistor and a source of supply voltage. A fourth N-channel transistor N0 has a gate coupled to the signal output, a source, and a drain coupled to ground. A fifth P-channel transistor N1 has a gate coupled to the control input, a source coupled to the drain of the first N-channel transistor MN1, and a drain coupled to the source of the fourth N-channel transistor N0.

The logic circuitry includes an AND gate I40 and inverter I41 for receiving the first and second logic signals coupled to the signal inputs of the P-channel and N-channel circuit portions. The logic circuitry also includes an exclusive-OR gate I37 for receiving the first and second logic signals coupled to the control inputs of the P-channel and N-channel circuit portions. The output of exclusive-OR gate I37 is directly coupled to the gate of transistor N1 and indirectly coupled to the gate of transistor P1 through inverter I47.

The schematic of FIG. 5 includes a Schmitt trigger circuit. Devices MN3 and N0 are parallel devices and provide a negative feedback path to the inverter formed by devices MN1, MN2, MP1, and MP2.

In operation, assume that the gate of transistor MN2 is at VSS and the drain of MN2 is at VDD. This situation occurs if "A" and "B" are at VDD. If both "A" and "B" transition from VDD to VSS, the gate of MN2 and MN1 begins to transition to VDD. When the gate of MN1 reaches $V_T$, MN1 begins to turn on since $V_{GS} \geq V_T$. However, because the gate of MN3 is at VDD, the source of MN2 is at VDD, minus the drop voltage across MN3. Thus, the $V_{GS}$ of MN2<<$V_T$ and MN2 remains off. As the gate of MN1 continues to rise, current flows from VDD through MN3 and MN1 to VSS, dividing the voltage VDD across transistors MN3 and MN1. If MN3 is sized to be larger than MN1, the voltage on the source of MN2 drops slowly, keeping MN2 off until its gate has risen to nearly VDD. Conversely, if MN3 is sized to be smaller than MN1, then the voltage on the source of MN2 falls rapidly and MN2 turns on when its gate is only slightly higher than $V_T$.

Transistor N1 serves as a pass gate either adding N0 in parallel with MN3 or isolating N0. Thus, N0 effectively adjusts the effective size of MN3. Transistor N1 is turned on only when "A" and "B" are different. The inverter formed by MN1, MN2, MP1, and MP2 is more resistant to change when "A" and "B" are different, and less resistant to change when "A" and "B" transition together.

Figure 6:
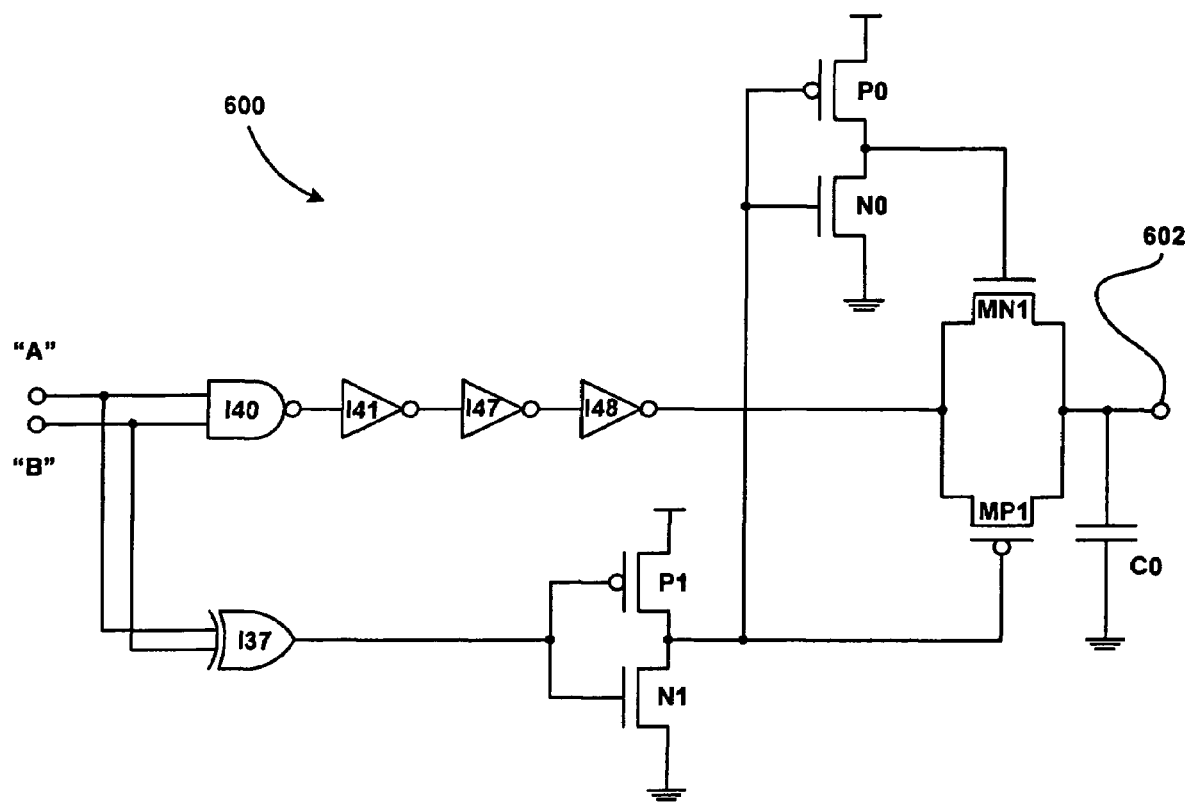
FIG. 6 is a more detailed transistor-level schematic for an implementation of the circuit shown in FIG. 3.

FIG. 6 is a more detailed transistor-level schematic for an implementation 600 of the circuit shown in FIG. 3. A radiation-hardened logic circuit 600 includes a first input for receiving a first logic signal "A", a second input for receiving a second logic signal "B", and an output 602 for providing a logic output signal substantially similar to either the first or the second logic signal, but wherein any radiation-induced pulses are substantially attenuated or removed. A first inverter includes transistors P1 and N1. A second inverter includes transistors P0 and N0 and has an input coupled to the output of the first inverter. A pass-gate circuit includes parallel-connected N-channel and P-channel transistors MN1 and MP1. The gate of transistor MP1 is coupled to the output of the first inverter. The gate of transistor MN1 is coupled to the output of the second inverter. The output of the pass-gate is coupled to node 602 for providing the logic output signal. Logic circuitry receives the first and second logic signals and is coupled to the inputs of the first inverter and the pass-gate circuit. A NAND gate I40 receives the first and second logic signals and is coupled to the input of the pass-gate circuit through inverters I41, I47, and I48. An exclusive-OR gate I37 receives the first and second logic signals and is coupled to the input of the first inverter. A capacitor C0 is coupled to the output node 602 to maintain the data state during pulse suppression. A latch (not shown in FIG. 6) can be substituted if desired.

While a specific transistor-level schematic is not shown for the logic circuit embodiment of FIG. 2, many circuit embodiments exist for latches 218 and 220, as well as exclusive-OR gate 206, and AND gate 208 that are known to those of skill in the art. Numerous changes in the logic and transistor-level implementation can be made for any of the circuits shown in FIGS. 2, 3, 5, and 6. As but one example, the two-input AND gates 208, 308, and I40 shown in FIGS. 2, 3, and 5 can all be replaced, if desired, by a buffered "wired" OR gate.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

I claim:

1. A radiation-hardened logic circuit comprising:
   an exclusive-OR gate having a first input for receiving a first logic signal, a second input for receiving a second logic signal, and an output; and
   gating circuitry having a first input for receiving the first logic signal, a second input for receiving the second logic signal, a control input coupled to the output of the exclusive-OR gate, a comparator having an adjustable input switching threshold controlled by the control input, and an output for providing an output logic signal.

2. The radiation-hardened logic circuit of claim 1 wherein the logic output signal is substantially similar to the first logic signal, but wherein any radiation-induced pulses are substantially attenuated or removed.

3. The radiation-hardened logic circuit of claim 1 wherein the logic output signal is substantially similar to the second logic signal, but wherein any radiation-induced pulses are substantially attenuated or removed.

4. The radiation-hardened logic circuit of claim 1 wherein the gating circuitry comprises:
   a first latch having an input for receiving the first logic signal, a control input coupled to the output of the exclusive-OR gate, and an output;
   a second latch having an input for receiving the second logic signal, a control input coupled to the output of the exclusive-OR gate, and an output; and
   a logic gate having a first input coupled to the output of the first latch, a second input coupled to the output of the second latch, and an output for providing the output logic signal.

5. The radiation-hardened logic circuit of claim 4 wherein the logic gate comprises a two-input AND gate.

6. The radiation-hardened logic circuit of claim 1 further comprising:
   a first logic block having an input for receiving an original logic signal and an output for providing the first logic signal; and
   a second logic block having an input for receiving the original logic signal and an output for providing the second logic signal,
   wherein the first and second logic blocks are substantially similar, and the first and second logic signals are substantially similar, except for the presence of any radiation-induced pulses.

7. A radiation-hardened logic circuit comprising:
   a first input for receiving a first logic signal;
   a second input for receiving a second logic signal substantially similar to the first logic signal except for the presence of radiation-induced pulses;
   an output for providing a logic output signal substantially similar to either the first or the second logic signal, but wherein any radiation-induced pulses are substantially attenuated or removed;
   a P-channel circuit portion having a signal input, a control input, and a signal output;
   an N-channel circuit portion having a signal input, a control input, and a signal output; and
   logic circuitry for receiving the first and second logic signals coupled to the signal inputs and control inputs of the P-channel and N-channel circuit portions, the signal outputs of the P-channel and N-channel circuit portions being coupled together to provide the logic output signal, and wherein the P-channel circuit portion includes
   a first P-channel transistor having a gate coupled to the signal input, a drain, and a source coupled to a source of supply voltage;
   a second P-channel transistor having a gate coupled to the signal input, a drain coupled to the signal output, and a source coupled to the drain of the first P-channel transistor;
   a third P-channel transistor having a gate coupled to the signal output and a current path coupled between the source of the second P-channel transistor and ground;
   a fourth P-channel transistor having a gate coupled to the signal output, a source, and a drain coupled to ground; and a fifth P-channel transistor having a gate coupled to the control input, a source coupled to the drain of the first P-channel transistor, and a drain coupled to the source of the fourth P-channel transistor.

8. The radiation-hardened logic circuit of claim 7 wherein the N-channel circuit portion comprises:
a first N-channel transistor having a gate coupled to the signal input, a drain, and a source coupled to ground;
a second N-channel transistor having a gate coupled to the signal input, a drain coupled to the signal output, and a source coupled to the drain of the first N-channel transistor;
a third N-channel transistor having a gate coupled to the signal output and a current path coupled between the source of the second N-channel transistor and ground;
a fourth N-channel transistor having a gate coupled to the signal output, a source, and a drain coupled to a source of supply voltage; and
a fifth N-channel transistor having a gate coupled to the control input, a source coupled to the drain of the first N-channel transistor, and a drain coupled to the source of the fourth N-channel transistor.

9. The radiation-hardened logic circuit of claim 7 wherein the logic circuitry comprises:
a first logic gate for receiving the first and second logic signals coupled to the signal inputs of the P-channel and N-channel circuit portions; and
a second logic gate for receiving the first and second logic signals coupled to the control inputs of the P-channel and N-channel circuit portions.

10. The radiation-hardened logic circuit of claim 9 wherein the first logic gate comprises a NAND gate.

11. The radiation-hardened logic circuit of claim 9 wherein the second logic gate comprises an exclusive-OR gate.

12. A radiation-hardened logic circuit comprising:
a first input for receiving a first logic signal;
a second input for receiving a second logic signal substantially similar to the first logic signal except for the presence of radiation-induced pulses;
an output for providing a logic output signal substantially similar to either the first or the second logic signal, but wherein any radiation-induced pulses are substantially attenuated or removed;
a first inverter having an input and an output;
a second inverter having an input coupled to the output of the first inverter and an output;
a pass-gate circuit including parallel-connected N-channel and P-channel transistors having an input and an output for providing the logic output signal, and having control inputs coupled to the outputs of the first and second inverters; and
logic circuitry for receiving the first and second logic signals coupled to the inputs of the first inverter and the pass-gate circuit.

13. The radiation-hardened logic circuit of claim 12 wherein the logic circuitry comprises:
a first logic gate for receiving the first and second logic signals coupled to the input of the pass-gate circuit; and
a second logic gate for receiving the first and second logic signals coupled to the input of the first inverter.

14. The radiation-hardened logic circuit of claim 13 wherein the first logic gate comprises a NAND gate.

15. The radiation-hardened logic circuit of claim 13 wherein the second logic gate comprises an exclusive-OR gate.

16. A radiation-hardened logic circuit comprising:
an exclusive-OR gate having a first input for receiving a first logic signal, a second input for receiving a second logic signal, and an output;
gating circuitry having a first input for receiving the first logic signal, a second input for receiving the second logic signal, a control input coupled to the output of the exclusive-OR gate, a logic gate coupled to a controlled pass-gate, and an output for providing an output logic signal, wherein the logic gate comprises a two-input AND gate.

17. A radiation-hardened logic circuit comprising:
an exclusive-OR gate having a first input for receiving a first logic signal, a second input for receiving a second logic signal, and an output;
gating circuitry having a first input for receiving the first logic signal, a second input for receiving the second logic signal, a control input coupled to the output of the exclusive-OR gate, a logic gate coupled to a controlled pass-gate, and an output for providing an output logic signal; and
a latch coupled to the controlled pass-gate.

* * * * *